(12) United States Patent
Arima

(10) Patent No.: US 7,187,016 B2
(45) Date of Patent: *Mar. 6, 2007

(54) SEMICONDUCTOR DEVICE

(75) Inventor: Yutaka Arima, Iizuka (JP)

(73) Assignee: Exploitation of Next Generation Co., Ltd, Fukuoka (JP)

( * ) Notice: Subject to any disclaimer, the term of this patent is extended or adjusted under 35 U.S.C. 154(b) by 243 days.

This patent is subject to a terminal disclaimer.

(21) Appl. No.: 10/221,137

(22) PCT Filed: Jan. 22, 2002

(86) PCT No.: PCT/JP02/00445

§ 371 (c)(1),
(2), (4) Date: Sep. 10, 2002

(87) PCT Pub. No.: WO02/059979

PCT Pub. Date: Aug. 1, 2002

(65) Prior Publication Data

US 2003/0030081 A1 Feb. 13, 2003

(30) Foreign Application Priority Data

Jan. 26, 2001 (JP) ................ 2001-18133

(51) Int. Cl.
*H01L 29/76* (2006.01)
(52) U.S. Cl. ............ 257/213; 257/215; 257/241; 257/288; 257/365; 257/366
(58) Field of Classification Search ........... 257/213, 257/215, 241, 288, 365, 366
See application file for complete search history.

(56) References Cited

U.S. PATENT DOCUMENTS 3,851,189 A * 11/1974 Moyer ................ 327/210

(Continued)

FOREIGN PATENT DOCUMENTS

JP 63-147370 6/1988

(Continued)

OTHER PUBLICATIONS

Hideyuki Matsuoka et al., "Mesoscopic transport in Si metal-oxide-semiconductor field-effect transistors with a dual-gate structure," Journal of Applied Physics, vol. 76, No. 9, Nov. 1, 1994, pp. 5561-5566.

(Continued)

*Primary Examiner*—Wai-Sing Louie
(74) *Attorney, Agent, or Firm*—Finnegan, Henderson, Farabow, Garrett & Dunner, LLP

(57) ABSTRACT

In a semiconductor device an electric field is controlled in direction or angle relative to a gate, or a channel to adjust a gain coefficient of a transistor. In some embodiments, there are provided a first gate forming a channel region in a rectangle or a parallelogram, and a second gate forming a channel region substantially containing a triangle between the channel region formed by the first gate and each of a source region and a drain region. In some embodiments, there is included a channel region formed by the first gate that is sandwiched by the channel region formed by the second gate, all the channel regions together substantially forming a rectangle or a parallelogram. As such, a semiconductor device allowing a gain coefficient β of an MOS transistor to be modulated by voltage in an analog manner can readily be produced by conventional processing technology and incorporated into any conventional LSIs configured by a CMOS circuit.

7 Claims, 8 Drawing Sheets

U.S. PATENT DOCUMENTS 4,996,571 A * 2/1991 Kume et al. ............ 365/185.19
5,614,427 A * 3/1997 den Boer et al. .............. 438/30
6,144,081 A 11/2000 Hsu et al.
6,246,080 B1 * 6/2001 Takahashi et al. .......... 257/288
6,342,717 B1 * 1/2002 Komatsu .................... 257/347
6,774,733 B2 * 8/2004 Arima ......................... 331/57

FOREIGN PATENT DOCUMENTS

| JP | 06-005851 | 1/1994 |
|----|-----------|--------|
| JP | 06-350088 | 12/1994 |
| JP | 09-129879 | 5/1997 |
| JP | 11-251582 | 9/1999 |

OTHER PUBLICATIONS

Hsiao C.-C. et al., "A Low Noise NMOSFET with Overlaid Metal Gate," 1998 IEEE MTT-S Digest, pp. 1711-1714.

* cited by examiner

3

4

5

SEMICONDUCTOR DEVICE

TECHNICAL FIELD

The present invention relates generally to semiconductor devices allowing an MOS transistor's gain coefficient β to be modulated by voltage in an analog manner and more specifically to semiconductor devices incorporated into an LSI to allow each device to have its characteristics adjusted on-chip so that a scheme can be implemented to automatically correct a timing of an operation between incorporated functional circuits that is associated with increased sizes of LSIs, a variation in device characteristics that increases as the device is increasingly microfabricated, and the like so that the device is expected to contribute to high performance of the LSI based on optimization of individual chips.

BACKGROUND ART

Large scale integrated circuit (LSI) devices represented by semiconductor integrated circuits have steadily been developed in performance over 30 years since their invention mainly through device microfabrication. Nowadays, however, various physical limits manifest themselves in device microfabrication and it is becoming extremely difficult to produce integrated circuit devices which are stable and uniform in quality. Depending only on device microfabrication is approaching its limit in enhancing LSI devices in performance. Conventional LSI designing technology based on fabrication of uniform devices should be reviewed.

Furthermore, as device microfabrication has further been pursued, recent LSI devices are further increased in size and increasingly highly integrated and a system is now implemented on-chip, and it is now essential that a large number of various functional circuits be integrated internal to a chip. In designing such a large-scale LSI device, it is particularly important to optimally adjust for example a timing of operation between the large number of integrated functional circuits to accurately operate the circuits. However, as LSIs have further various and complicated functions integrated therein, ensuring an operating margin for covering a process variation unavoidable in the LSI's production process has become an obstacle to further enhancing a large-scale LSI device in performance in future. In other words, enhancing the LSI device in performance in future essentially entails a development of a new LSI design and production means accommodating a variation in device characteristics that is large to an extent.

Such an issue as no longer ignorable in enhancing an LSI device in performance that is associated with unevenness of devices that varies for each LSI chip produced, such as a spatial variation in device characteristics in a chip and a variation of a median of device characteristics that is attributed to a process variation, can effectively be addressed by providing the exact LSI chip with a so-called self-adaptive or optimizing function, a function to automatically adjust and compensate for a variation in characteristics of integrated devices for each LSI chip to enhance device performance.

However, this has not readily been implemented with conventional technology. Conventionally, using a plurality of MOS transistors and for example switching the number of their parallel connections via an electrical switch, as implemented in a circuit, was a possible means for mounting a self adjustment function on an LSI chip. This technique, however, is significantly inefficient in terms of precision in adjustment, and circuit scale.

FIGS. 12 to 15A and 15B show an exemplary configuration of a circuit capable of electrically modulating a substantial gain coefficient of an MOS transistor by using a plurality of MOS transistors. FIG. 12 shows an exemplary configuration of a circuit with two MOS transistors 11 and 12 connected in parallel. Transistor 11 has a gate electrode receiving a normal signal voltage and transistor 12 has gate electrode receiving a signal voltage or an OFF voltage (a voltage for which the MOS transistor turns off) depending on a switch 13. Switch 13 is typically configured by a CMOS switch (a parallel connection of p-MOS and n-MOS), a single inverter producing a gate signal thereof and a latch circuit for holding a state of the switch, and it requires a total of approximately 24 transistors. When switch 13 connects the gate electrode of transistor 12 to a signal voltage, this circuit operates as an MOS transistor with transistors 11 and 12 connected in parallel. When switch 13 connects the gate electrode of transistor 12 to the OFF voltage, in this circuit, only transistor 11 operates.

FIG. 13 shows an exemplary configuration of a circuit with five transistors connected in parallel. There can be implemented 16 variations depending on states of four switches 13. Setting each of gain coefficients of four transistors 12 raised to a power of 2 can provide a coefficient having a value in 16 levels at equal intervals.

FIG. 14A shows an exemplary configuration of a circuit with two MOS transistors connected in series. In this example, switch 13 connects the gate electrode of transistor 12 to either a signal voltage or an ON voltage (a voltage for which the MOS transistor turns on). As shown in FIG. 14B, when switch 13 connects the gate electrode of transistor 12 to the signal voltage, the circuit operates as an MOS transistor with transistors 11 and 12 connected in series. In contrast, as shown in FIG. 140, when switch 13 connects the gate electrode of transistor 12 to the ON voltage, the circuit operates as a circuit with the transistor 12 ON resistance connected to transistor 11 in series.

FIG. 15A shows an example of a configuration applying a control voltage to the gate electrode of transistor 12 and depending on the control voltage value to adjust a resistance connected to transistor 11 in series. More specifically, as shown in FIG. 15B, transistor 12 serves as a variable resistance having a value in resistance corresponding to the control voltage.

The FIGS. 12 and 13 circuit configuration examples based on parallel connection are disadvantageous as precision with which characteristics can be adjusted and circuit scale have a trade-off relationship and enhanced precision of adjustment results in an increased circuit scale. Furthermore, the FIGS. 14A–14C and 15A–15B circuit configuration examples based on series connection disadvantageously result in increased circuit scales and in addition provide an effective range of adjustment of characteristics that is limited by series interposition of a component of resistance indicating non-linear characteristics relative to an input signal.

A system modulating electrical characteristics of a transistor that depends on such a circuit configuration as described above has inherently imposed thereon a restriction that a number of devices several to several ten times that of devices to be adjusted needs to be consumed. As such, it hardly conforms with mounting a self-adjustment function for the purpose of pursuing high integration and enhancing the LSI in performance. Accordingly there is a demand for development of a new semiconductor device allowing high-precision modulation of electrical characteristics without interfering with high integration.

DISCLOSURE OF THE INVENTION

The present invention contemplates a novel semiconductor device capable of high-precision modulation of electrical characteristics without preventing high integration, the semiconductor device allowing mounting on any LSIs a circuit of a mechanism providing on-chip automatic adjustment of a device parameter to correct variation in characteristics so as to implement a self-optimizing LSI, a self-adaptive LSI or other similar, completely new, active LSIs tolerating device characteristics varying to some extent.

In accordance with the present invention the semiconductor device is characterized in that an electric field is controlled in direction (angle) relative to a gate or a channel to adjust a gain coefficient of a transistor.

In accordance with the present invention in another aspect the semiconductor device includes a first gate forming a channel region in a rectangle or a parallelogram, and a second gate for forming a channel region substantially in a triangle or a trapezoid substantially containing a triangle (i.e., a generally triangular or trapezoidal channel region) between a source region and the channel region formed by the first gate and between a drain region and the channel region formed by the first gate.

Preferably the channel region formed by the first gate and the channel region formed by the second gate sandwiching the channel region formed by the first gate, together form a channel region substantially in a rectangle or a parallelogram.

Furthermore, preferably the channel region formed by the first gate and the channel region formed by the second gate are different in conductance.

Still preferably the channel region formed by the first gate is smaller in conductance than the channel region formed by the second gate.

Or preferably the channel region formed by the first gate and the channel region formed by the second gate are uniform in conductance.

Furthermore, preferably the first gate and the second gate are produced and formed in different processes, respectively.

Or preferably the first gate and the second gate are produced and formed in a single processes.

As such, a semiconductor device capable of modulating an MOS transistor transistor's gain coefficient β by voltage in an analog manner can be readily produced with conventional processing technology and incorporated into any conventional LSIs configured of a CMOS circuit. As a result a circuit of a mechanism providing on-chip automatic adjustment of a device parameter to correct variation in characteristics can be mounted on any LSIs to implement a self-optimizing LSI, a self-adaptive LSI or other similar, completely new, active LSIs tolerating device characteristics varying to some extent. A limit can significantly be alleviated that is attributed to a variation in characteristics that is associated with device microfabrication, a variation in device characteristics that is associated with process variation or other similar unevenness in characteristics that has been a factor preventing a large-scale LSI from having enhanced performance.

BEST MODES FOR CARRYING OUT THE INVENTION

Figure 1:
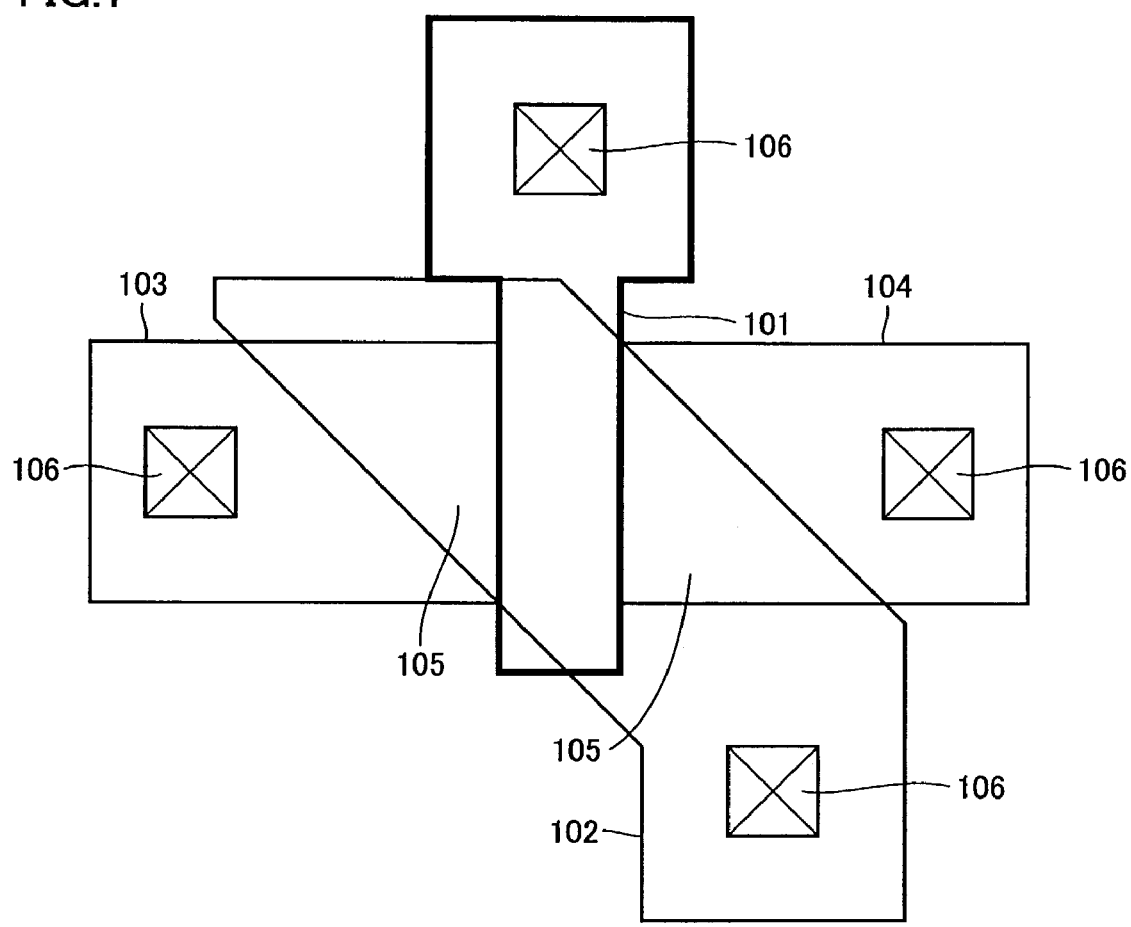
FIG. 1 shows a configuration of a semiconductor device of the present invention in a first embodiment.

Hereinafter a semiconductor device of the present invention in embodiments will more specifically be described with reference to the drawings. In the figures, like components are denoted by like reference characters.

First Embodiment

Device Structure

Initially in order to clarify a feature of a basic structure of the semiconductor device in a first embodiment FIG. 1 shows an exemplary configuration in layout regarding basic components of the device. In the first embodiment the semiconductor device is structurally characterized by additional introduction of a control gate having a fixed angle relative to a typical MOS gate.

FIG. 1 shows a typical MOS gate 101, a control gate 102, a source region 103, a drain region 104, a control channel region 105, and a contact region 106 electrically connected to a metal wire to extract an electrode.

In the first embodiment the semiconductor device is characterized in that control channel region 105 underlying control gate 102 substantially forms a triangle between typical MOS gate 101 and source 103/drain 104, and control channel region 105 underlying control gate 102 and a channel region underlying MOS gate 101 together form a channel region substantially in a parallelogram.

As shown in FIG. 1, it is possible to form control gate 102 overlapping on MOS gate 101 by using a gate layer distinguished from MOS gate 101. Furthermore, control channel region 105 underlying control gate 102 may be formed to have the same characteristics as the channel underlying typical MOS gate 101, or it may be different in impurity concentration from that underlying MOS gate 101 to provide independently adjustable channel conductance.

The semiconductor device of the first embodiment can be fabrication by a conventional MOS transistor fabrication process except forming the additionally introduced control gate 102 and the control channel 105 formed thereunder. It is thus not necessary to significantly change the conventional fabrication process to incorporate the device.

Figure 2:
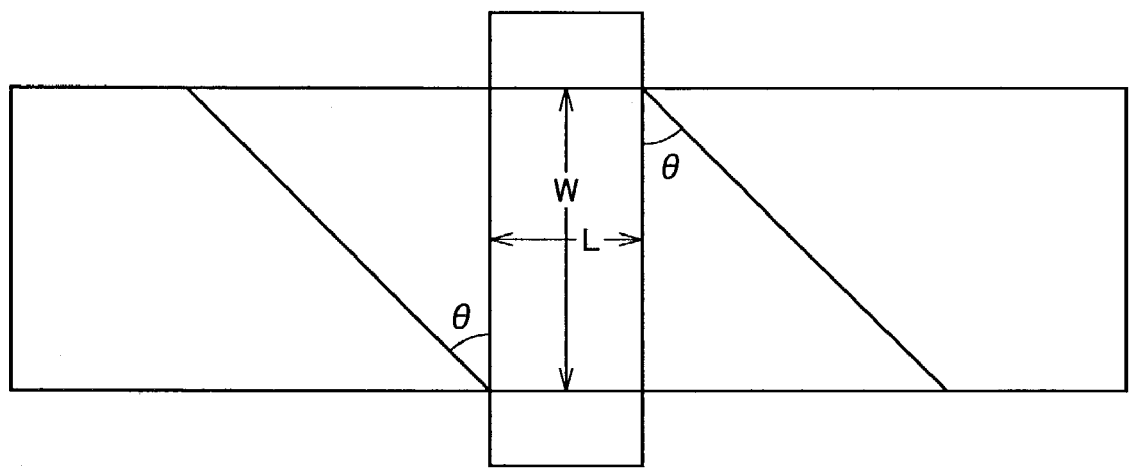
FIG. 2 represents a geometrical parameter defining characteristics of the semiconductor device of the first embodiment.

As described above, the semiconductor device of the first embodiment is characterized in that a control gate is added to a conventional MOS transistor and electrically a single electrode for the control gate is added to the conventional MOS transistor to provide a total of four electrodes (a total of five electrodes if a back gate is included) to the device. Furthermore, in the present semiconductor device, as shown in FIG. 2, the three values of a length L and a width W of MOS gate 101 and an angle θ formed by control gate 102 and MOS gate 101 are used as the device's geometrical parameter defining the device characteristics.

Characteristics Modulation Mechanism

In the semiconductor device of the first embodiment, by a value in voltage applied to control gate 102 a value in resistance (or conductance) of control channel 105 underlying control gate 102 can be controlled to modulate a direction of an electric field having a direction of a channel that is applied to the channel underlying MOS gate 101 and effective gate length and width can be changed to control gain coefficient β of a transistor by voltage.

Figure 3:
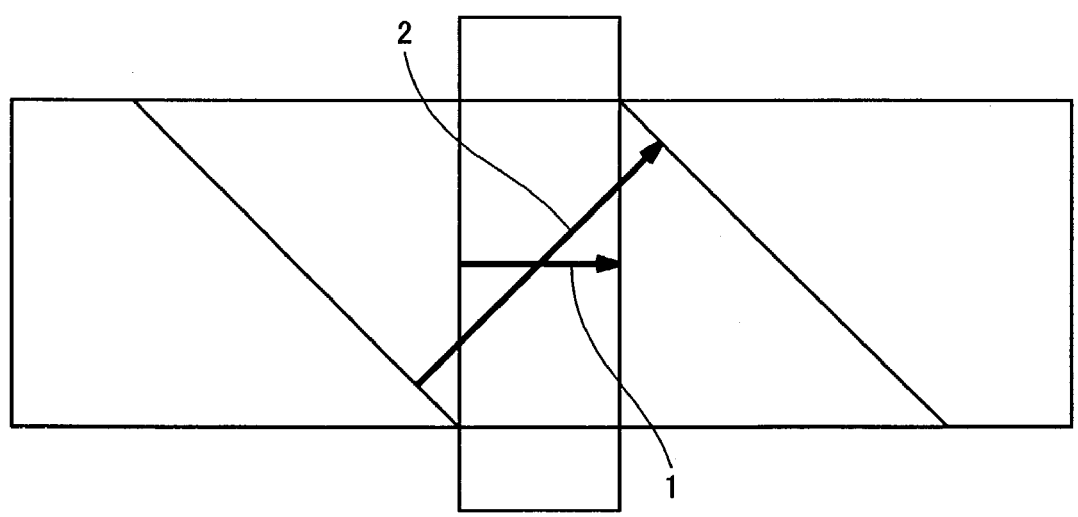
FIG. 3 represents an electric field applied to an MOS channel of the semiconductor device of the first embodiment.
Figure 4:
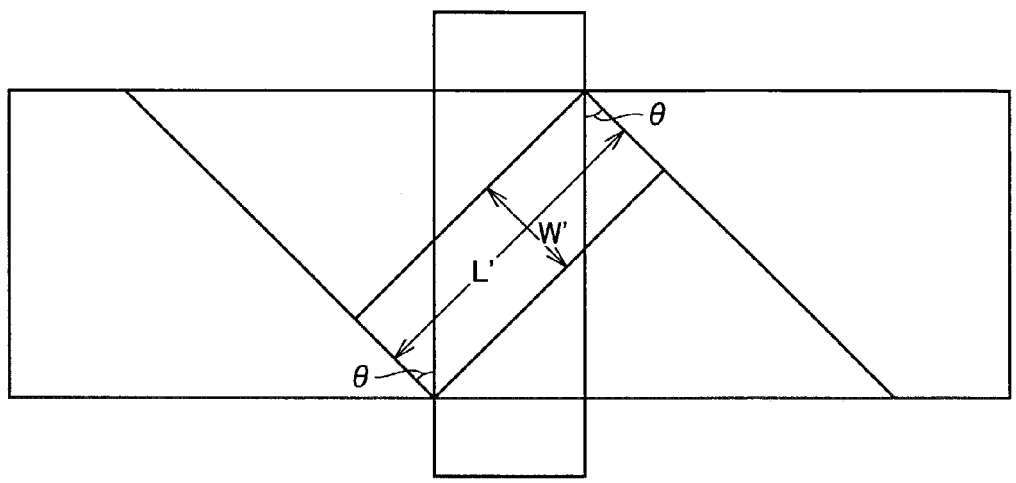
FIG. 4 illustrates a mechanism of modulation of characteristics of the semiconductor device of the first embodiment.

Description will now be made of a mechanism allowing the semiconductor device of the first embodiment to electrically modulate gain coefficient β. In FIG. 3, one arrow represents a direction of an electric field provided when control channel 105 underlying control gate 102 has a resistance (or conductance) having approximately the same value as an ON resistance of MOS gate 101 (i.e., an ON resistance of a transistor portion formed by MOS gate 101) and the other arrow represents a direction of an electric field provided when the former resistance is sufficiently smaller than the latter, ON resistance. If control channel 105 has a resistance sufficiently smaller than the ON resistance of the channel underlying MOS gate 101, then, as indicated in FIG. 3 by an arrow 1, an electric field has a direction substantially perpendicular to MOS gate 101 (or parallel to the direction of the channel underlying MOS gate 101) and substantial gain coefficient β is in proportion to W/L. If control channel 105 has a resistance having approximately the same value as the ON resistance of MOS gate 101, then, as indicated in FIG. 3 by an arrow 2, an electric field has a direction perpendicular to a boundary of control gate 102 and source 103 and drain 104, and substantially L is increased and W is decreased, and β is decreased. With reference to FIG. 4, if the control channel has a resistance approximately equal in level to the ON resistance of the MOS gate, effective gate length L' and width W' can approximately be represented by expressions (1) and (2) and β' is in proportion to an expression (3):

$$W' = \cos\theta \ast (W - L \ast \tan\theta) \quad (1)$$

$$L' = \cos\theta \ast (L + W \ast \tan\theta) \quad (2)$$

$$\beta' \propto (W/L - \tan\theta)/(1 + W/L \ast \tan\theta) \quad (3).$$

In this scenario, control channel 105 has a maximal resistance corresponding to the ON resistance of MOS gate 101. If the resistance is larger, gain coefficient β is expected to be further decreased. However, if control channel 105 has its resistance larger than the ON resistance of MOS gate 101 for a device with MOS gate 101 and control gate 102 equivalent in channel conductance, a portion of control channel region 105 that is closer to drain 104 is saturated and such an approximation as represented by the above expression would not be achieved and no longer be represented by a simple expression. At any rate, gain coefficient β is expected to be substantially smaller when control channel 105 is larger in resistance.

In the semiconductor device of the present invention, as can be seen from the above expressions, a voltage applied to control gate 102 is adjusted to change a resistance of control channel 105 to continuously adjust gain coefficient β from W/L to approximately (W/L−tan θ)/(1+W/L*tan θ) (if the control channel has a maximal resistance having approximately the same level as an ON voltage of an MOS). Furthermore, it can be adjusted in a range set, substantially as desired, by adjusting the device's three geometrical parameters, as described hereinafter.

Forecast of Characteristics of Modulation

Figure 5:
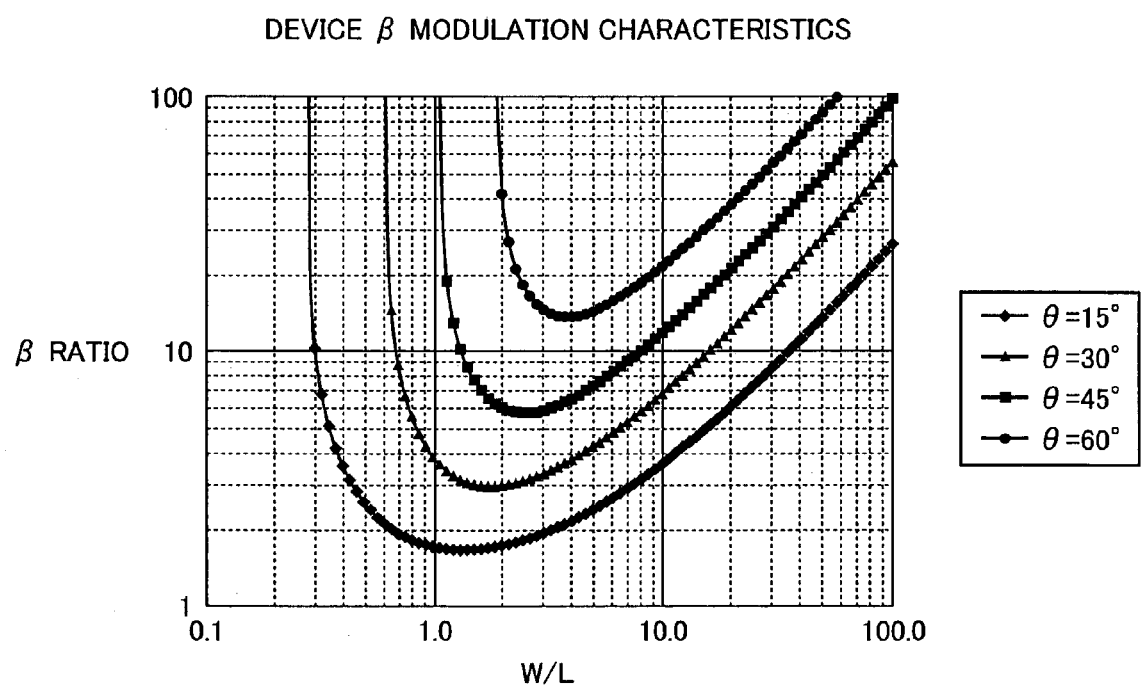
FIG. 5 represents performance of modulation of characteristics of the semiconductor device of the first embodiment.

In the semiconductor device of the present embodiment, as has been described previously, length L and width W of an MOS gate and angle θ formed by the MOS gate and a control gate determine a range in which β can be adjusted. Accordingly FIG. 5 represents with angle θ serving as a parameter how a β ratio (a maximum value/a minimum value) corresponding to a range allowing β to be adjusted therein for the semiconductor device of the present invention can be set by the MOS gate's W/L serving as a geometrical parameter of the device. Note that also herein, to use the aforementioned expression for approximation the control channel is adapted to have a maximal resistance approximately corresponding to the ON resistance of the MOS gate.

In the semiconductor device of the present invention, as can be seen from FIG. 5, β can be adjusted in a range corresponding to a superimposition of a component increasing in proportion to W/L and a component rapidly increasing as W/L decreases, and each item increases in proportion to θ. The component proportional to W/L is attributed to that modulation of substantial gate channel length L which accompanies modulation of an electric field in direction, and the component rapidly increasing as W/L decreases is attributed to that modulation of substantial gate channel width W which accompanies modulation of an electric field in direction. Furthermore, since angle θ is in proportion to the magnitude of maximal modulation of an electric field in direction, it is in proportion to each of two components. It can be understood from these features that β can be adjusted within a range set with a relatively high degree of freedom depending on the application, the allowed device size and the like of interest.

Effect

Figure 6A:
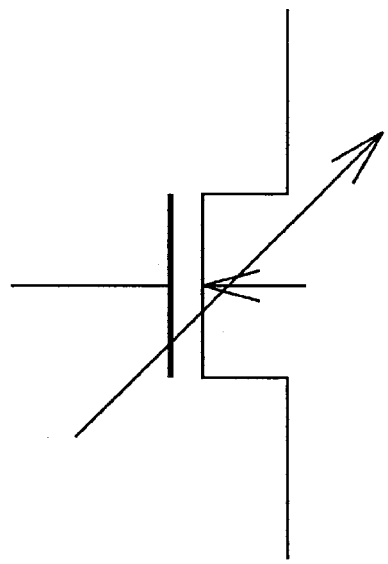
FIGS. 6A and 6B show an example of a configuration of a CMOS circuit depending on the semiconductor device of the first embodiment.
Figure 6B:
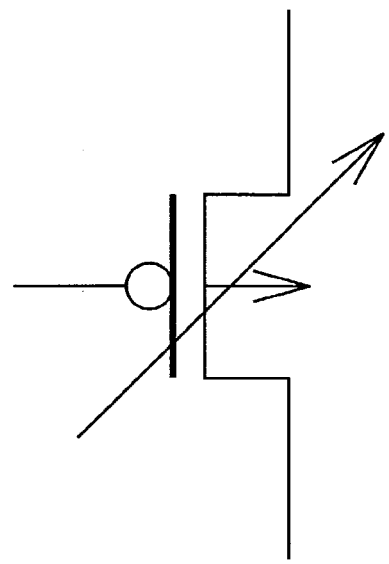
Figure 7A:
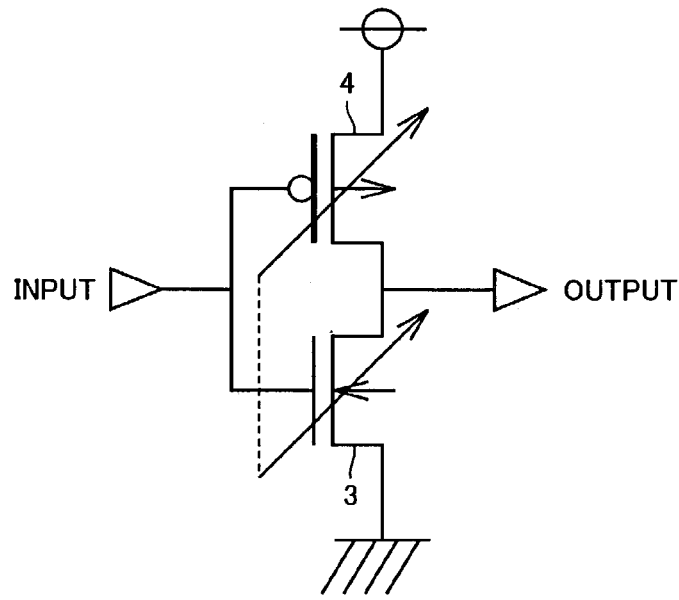
FIGS. 7A and 7B show an example of a configuration of a CMOS circuit depending on the semiconductor device of the first embodiment.
Figure 7B:
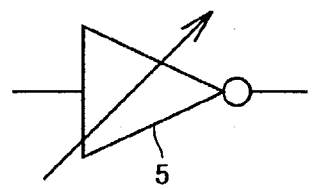

Thus in the semiconductor device of the first embodiment gain coefficient β can continuously be modulated by a voltage applied to control gate 102 and the voltage adjustable β can be controlled within a range determined by length L and width W of MOS gate 101 and angle θ formed by MOS gate 101 and control gate 102, and with a realistic device size (an increase in area by a control gate alone) a ratio of minimal β and maximal β can be set relatively freely from several times to more than several hundreds times. Additionally in the semiconductor device of the first embodiment the power consumption with which β can be modulated is significantly small and will not become a problem in case of practical use, as it is attributed simply to the leaking current of the control gate. Furthermore in the semiconductor device of the first embodiment n-MOS transistor 3 and p-MOS transistor 4 can both be configured similarly, as shown in FIGS. 6A and 6B, respectively. As such, like an inverter circuit 5 exemplarily shown in FIGS. 7A and 7B, drivability of each type of gate by a CMOS circuit can electrically be adjusted, and an application is expected as a basic element of a future self-adaptive LSI.

Second Embodiment

Figure 8:
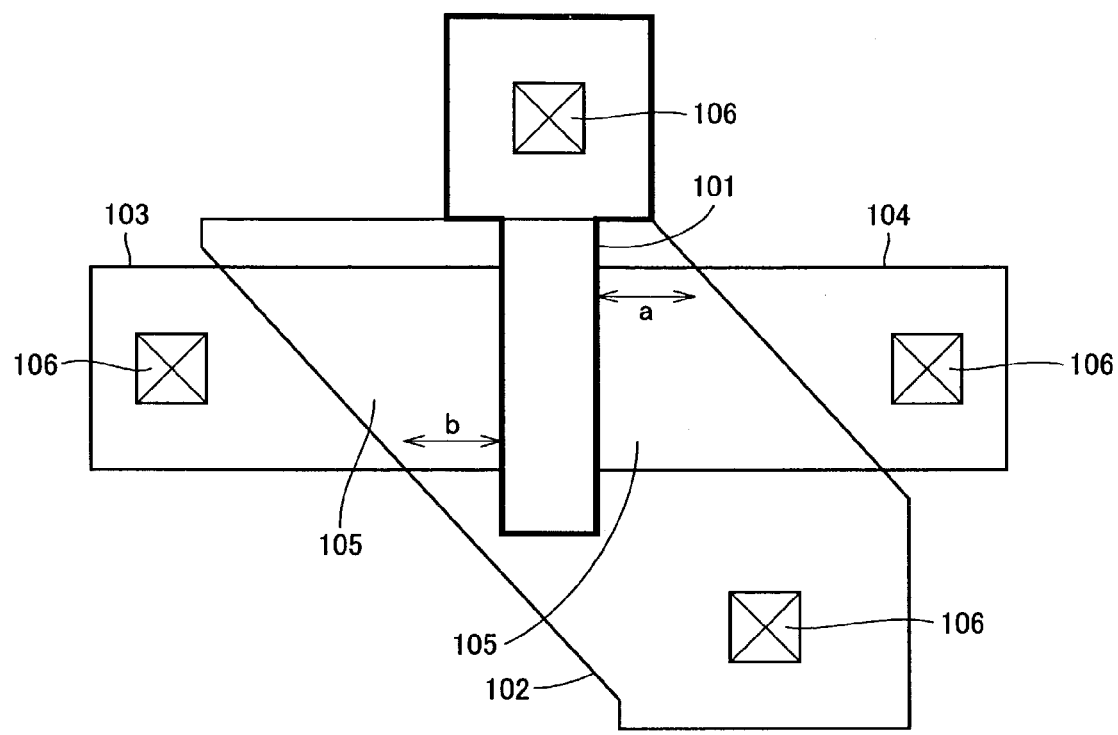
FIGS. 8–11 show configurations of the semiconductor device of the present invention in second to fifth embodiments, respectively.

FIG. 8 shows a configuration of the semiconductor device of the present invention in a second embodiment. The second embodiment differs from the first embodiment in the geometry of control channel 105 underlying control gate 102. In this example, each control channel 105 is formed substantially in a trapezoid. Nonetheless, similar device characteristics can be achieved if each control channel 105 and the channel region underlying MOS gate 101 together form a channel region substantially in a parallelogram. Note, however, that the expressions (1)–(3) for approximation need to be modified slightly, as represented in expressions (4) and (5):

$$W' = \cos\theta * (W - (L+a+b)*\tan\theta) \quad (4)$$

$$L' = \cos\theta * (L+a+b+W*\tan\theta) \quad (5)$$

and β' is in proportion to the following expression:

$$\beta' \propto (W/L - (1+a/L+b/L)*\tan\theta)/(1+a/L+b/L+W/L*\tan\theta) \quad (6)$$

wherein a and b are each a length of a rectangular portion in each control channel of FIG. 8 that extends in the direction of the channel. The present embodiment indicates that a control channel region is not limited to a rectangle in geometry.

Third Embodiment

Figure 9:
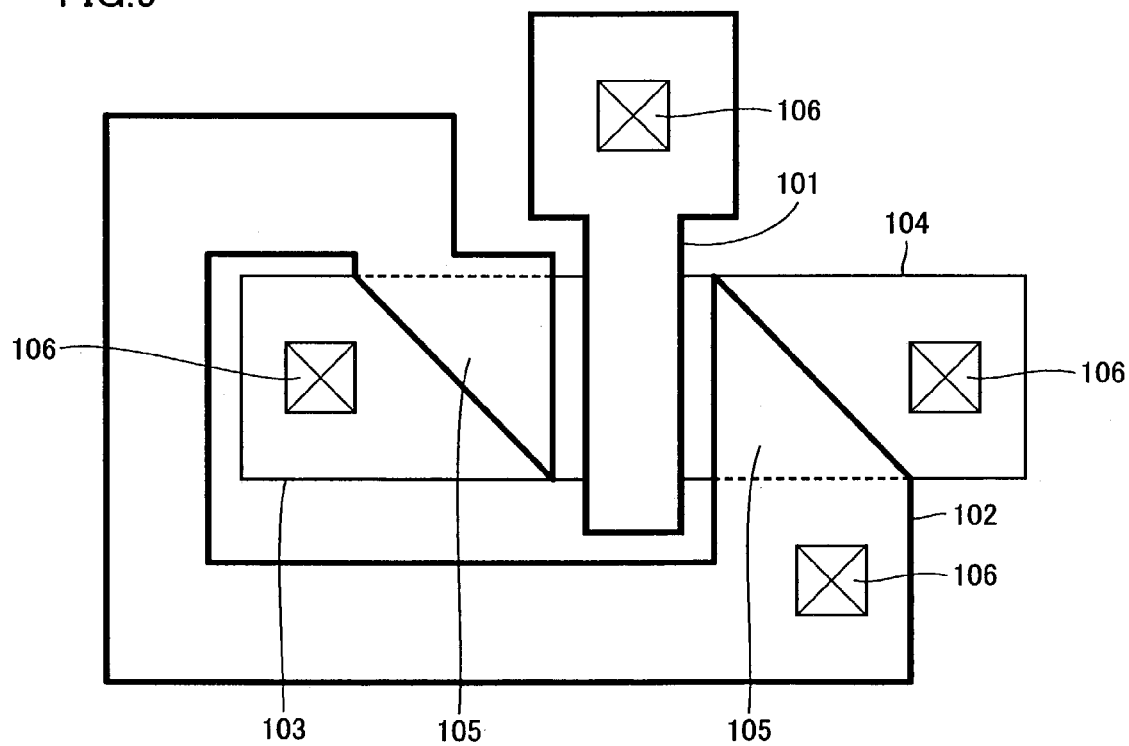

FIG. 9 shows a configuration of the semiconductor device of the present invention in a third embodiment. The third embodiment is different from the first embodiment in that control gate 102 is formed by the same layer that forms MOS gate 101. If control gate 102 and MOS gate 101 are formed by a single gate layer the gates are electrically separated. Accordingly the gates are not allowed to overlap and, as shown in FIG. 9, they need to have a gap between control gate 102 and MOS gate 101 (so that they can be separated and processed).

Even in that case, the gap between control gate 102 and MOS gate 101 is provided in the same step that forms the source and drain, and the resistance is significantly small in value and this device configuration also exhibits characteristics which electrically do not differ from the first embodiment. Gain coefficient β modulated is approximated, as represented by expressions (4)–(6), wherein a and b represent a gap between control gate 102 and MOS gate 101. The third embodiment indicates that forming control gate 102 does not require an additional step of forming another gate layer.

Fourth Embodiment

Figure 10:
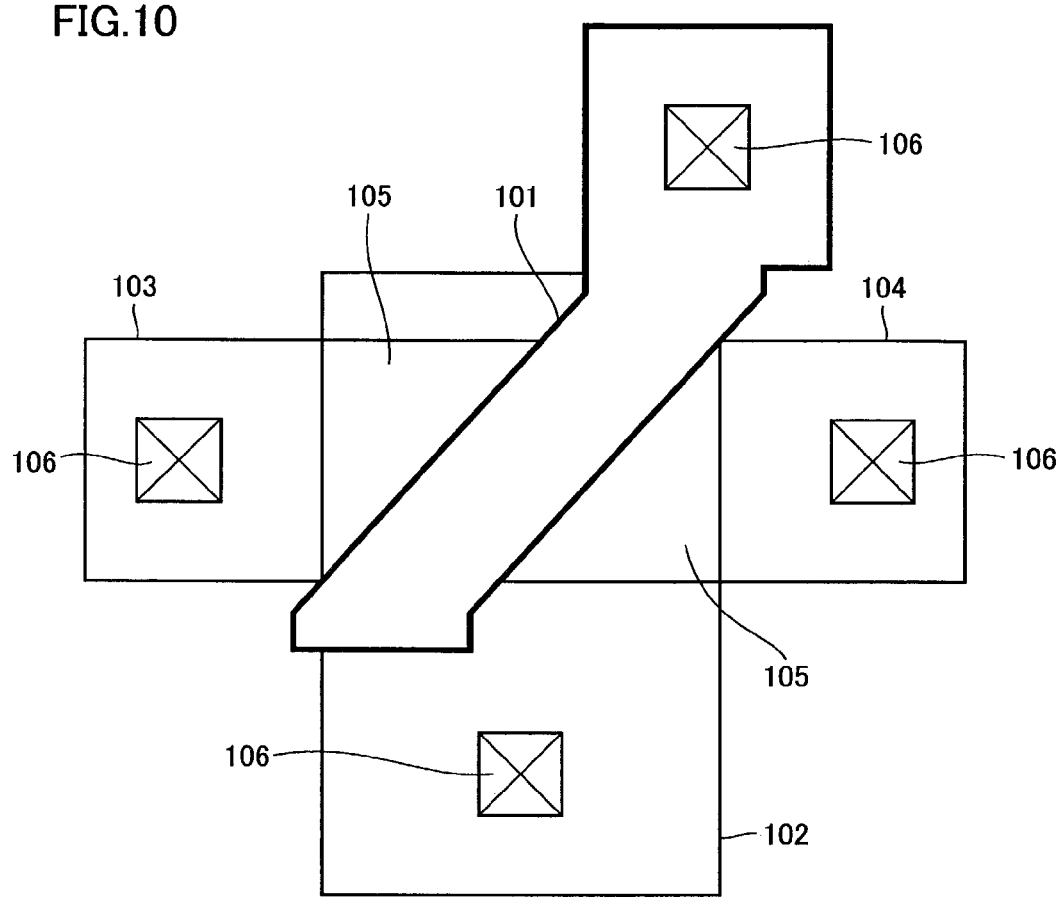

FIG. 10 shows a configuration of the semiconductor device of the present invention in a fourth embodiment. As compared with the first embodiment, the fourth embodiment exemplarily shows another layout for control gate 102 and MOS gate 101. It is different from the first embodiment shown in FIG. 1 only in that whether a gate perpendicular to an active region of a transistor is MOS gate 101 or control gate 102. Substantially it is as effective as the first embodiment. The fourth embodiment indicates that the semiconductor device of the present invention has a feature which has a significance only in a relative angle formed by control gate 102 and MOS gate 101 and is not limited to an angle relative to each source/drain or the like.

Fifth Embodiment

Figure 11:
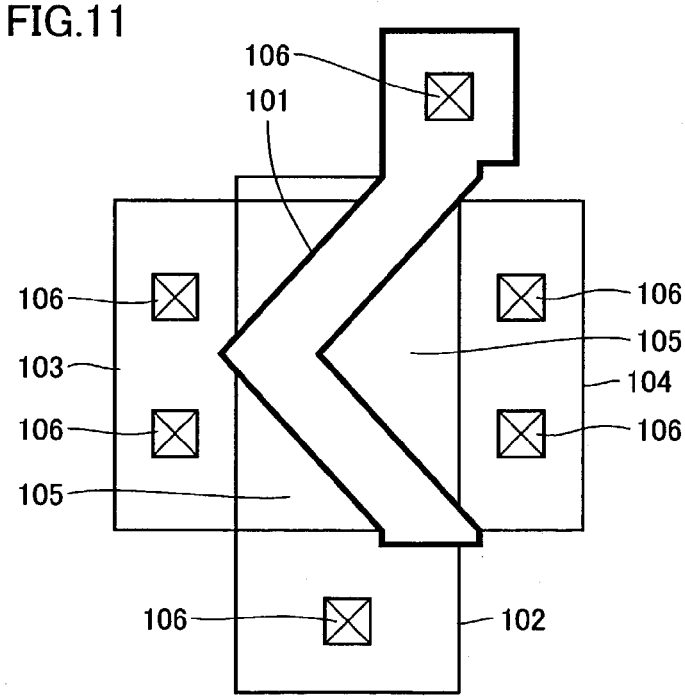
Figure 12:
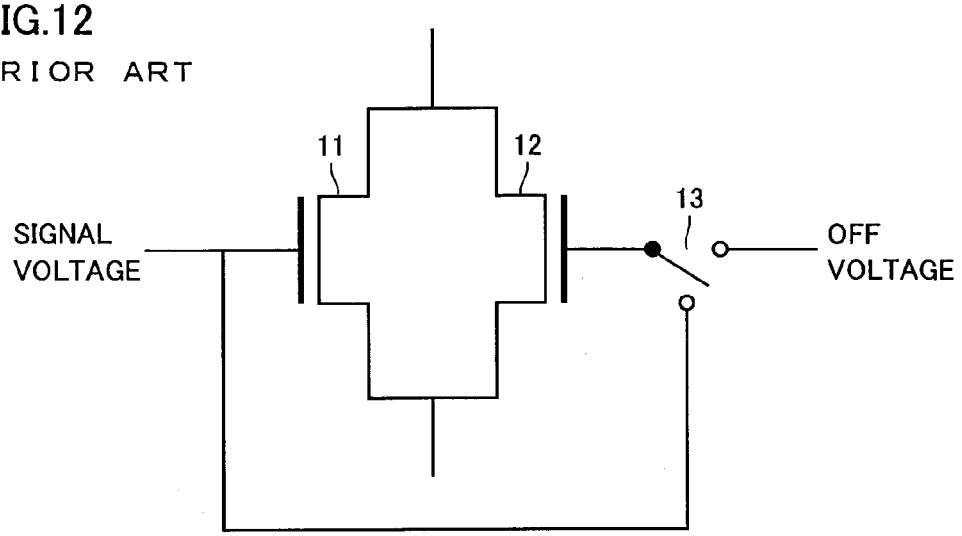
FIGS. 12 and 13 illustrate first and second conventional examples, respectively, of a semiconductor device capable of controlling a substantial gain coefficient.
Figure 13:
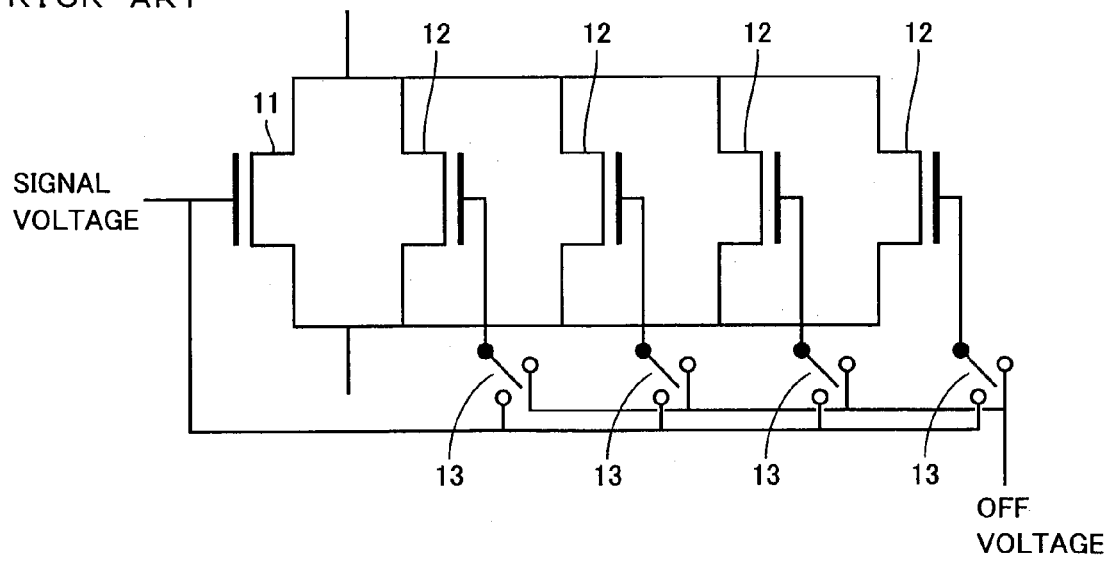
Figure 14A:
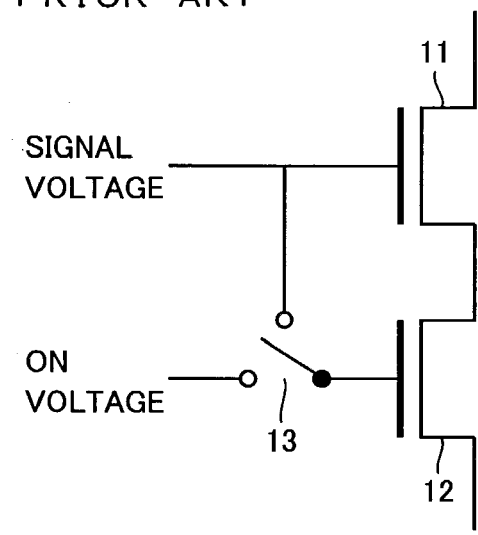
FIGS. 14A–14C illustrate a third conventional example of the semiconductor device capable of controlling the substantial gain coefficient.
Figure 14B:
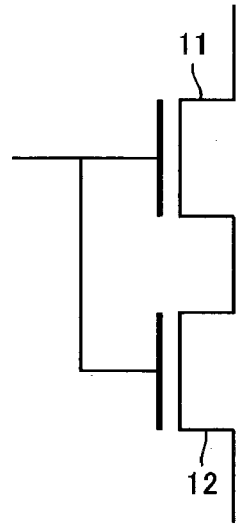
Figure 14C:
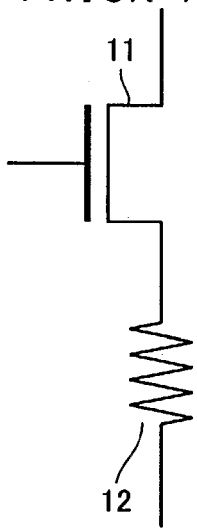
Figure 15A:
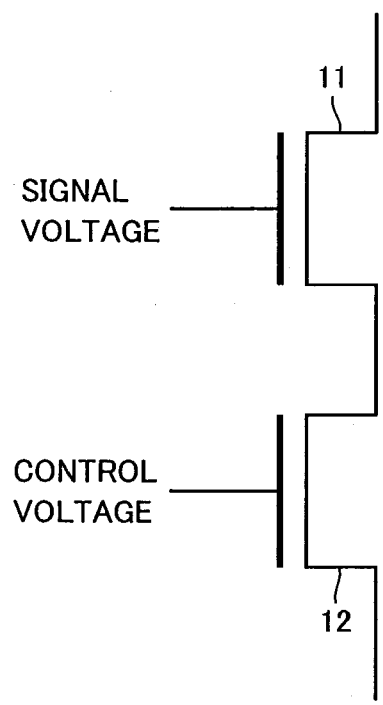
FIGS. 15A and 15B illustrate a fourth conventional example of the semiconductor device capable of controlling the substantial gain coefficient.
Figure 15B:
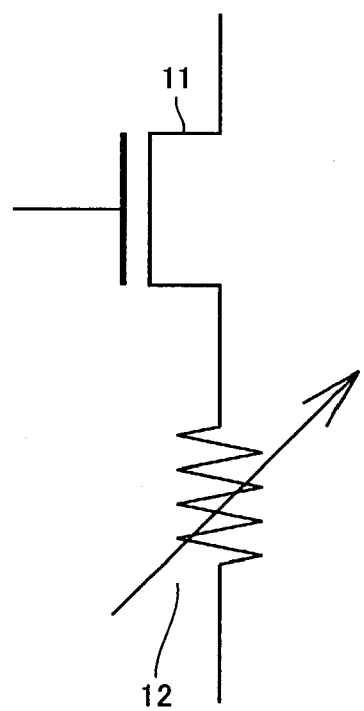

FIG. 11 shows a configuration of the semiconductor device of the present invention in a fifth embodiment. The fifth embodiment shows a configuration provided if MOS gate width W is sufficiently increased while control gate 102 and MOS gate 101 form angle θ maintained large. More specifically, it corresponds to the semiconductor device of the fourth embodiment that is arranged in succession in parallel and MOS gate 101 is obliquely folded back (or jagged). If large gain coefficient β is desired in the semiconductor device of the present invention, the fifth embodiment is effective in reducing the size of the device.

INDUSTRIAL APPLICABILITY

The semiconductor device of the present invention is applicable as a circuit element of a large-scale and highly integrated LSI.

The invention claimed is:

1. A semiconductor device comprising:
a first gate forming a channel region quadrangular in a rectangle or a parallelogram; and
a second gate for forming a channel region substantially in a triangle or a trapezoid substantially containing a triangle between a source region and said channel region formed by said first gate and between a drain region and said channel region formed by said first gate.

2. The semiconductor device of claim 1, characterized in that all the channel regions including said channel region formed by said first gate and said channel region formed by said second gate sandwiching said channel region formed by said first gate together substantially form a rectangle or a parallelogram.

3. The semiconductor device of claim 1, characterized in that said channel region formed by said first gate and said channel region formed by said second gate are different in conductance.

4. The semiconductor device of claim 1, characterized in that said channel region formed by said first gate and said channel region formed by said second gate are uniform in conductance.

5. The semiconductor device of claim 1, characterized in that said first gate and said second gate are produced and formed in different processes, respectively.

6. The semiconductor device of claim 1, characterized in that said first gate and said second gate am produced and formed in a single process.

7. The semiconductor device of claim 3, characterized in that said channel region formed by said first gate is smaller in conductance than said channel region formed by said second gate.

* * * * *

UNITED STATES PATENT AND TRADEMARK OFFICE
CERTIFICATE OF CORRECTION

PATENT NO. : 7,187,016 B2
APPLICATION NO. : 10/221137
DATED : March 6, 2007
INVENTOR(S) : Yutaka Arima It is certified that error appears in the above-identified patent and that said Letters Patent is hereby corrected as shown below:

Column 8, line 58, "am" should read --are--.

Signed and Sealed this

First Day of May, 2007

JON W. DUDAS
*Director of the United States Patent and Trademark Office*